United States Patent
Watanabe

[11] Patent Number: 5,933,371
[45] Date of Patent: Aug. 3, 1999

[54] WRITE AMPLIFIER FOR USE IN SEMICONDUCTOR MEMORY DEVICE

[75] Inventor: Yohji Watanabe, Yokohama, Japan

[73] Assignee: Kabushiki Kaisha Toshiba, Kawasaki, Japan

[21] Appl. No.: 09/105,052

[22] Filed: Jun. 26, 1998

[51] Int. Cl.[6] .................................................. G11C 7/00
[52] U.S. Cl. ..................... 365/189.05; 365/190; 326/83; 327/108
[58] Field of Search ............................... 365/189.05, 190, 365/189.01; 326/83, 82, 87; 327/108, 112

[56] References Cited

U.S. PATENT DOCUMENTS

| | | | |
|---|---|---|---|
| 4,697,107 | 9/1987 | Haines | 307/474 |
| 4,983,860 | 1/1991 | Yim et al. | 307/443 |
| 5,216,292 | 6/1993 | Imazu et al. | 307/443 |
| 5,387,824 | 2/1995 | Michelsen | 326/83 |
| 5,450,019 | 9/1995 | McClure et al. | 326/28 |
| 5,583,460 | 12/1996 | Dohi et al. | 327/126 |
| 5,598,371 | 1/1997 | Lee et al. | 365/189.05 |
| 5,602,783 | 2/1997 | Ong | 365/189.05 |
| 5,698,994 | 12/1997 | Tsuji | 326/83 |
| 5,812,461 | 9/1998 | Komarek et al. | 365/189.05 |

*Primary Examiner*—Son Mai
*Attorney, Agent, or Firm*—Banner & Witcoff, Ltd.

[57] ABSTRACT

In a DQ write amplifier, a data line DQ is precharged and driven by one P-channel MOS transistor and a data line /DQ is precharged and driven by one P-channel MOS transistor. These transistors are controlled by a control circuit composed of NAND circuits and inverters. In the DQ write amplifier, a transition is made from the precharge state to the write state through the use of only a write signal applied to the control circuit.

12 Claims, 4 Drawing Sheets

WRITE AMPLIFIER FOR USE IN SEMICONDUCTOR MEMORY DEVICE

BACKGROUND OF THE INVENTION

The present invention relates to a write amplifier adapted for dynamic random access memories (DRAMs) and synchronous DRAMs.

Write amplifiers (DQ write amplifiers) and read amplifiers (DQ read amplifiers) are among the most important circuits for implementing high-performance DRAMs. The DQ read/write amplifier is connected to a complementary pair of data lines DQ and /DQ which are large in length and capacitance as compared with bit lines. At data read time, the DQ read amplifier amplifies data which is read from a memory cell, amplified by a sense amplifier, and then outputs it onto the data lines DQ and /DQ. The data amplified by the DQ read amplifier is applied through read/write data buses RWD and /RWD and an input/output buffer to an input/output pad. At data write time, the DQ write amplifier amplifies data supplied through the input/output pad, the input/output buffer, and the read/write data buses RWD and /RWD and outputs it onto the paired data lines DQ and /DQ. The data on the data lines DQ and /DQ is written into a memory cell via a selected sense amplifier. Thus, the DQ read/write amplifier functions as a second sense amplifier.

To perform the above-described operation, the DQ write amplifier requires the following functions:

(1) In the standby state, precharges the data lines DQ and /DQ to a predetermined potential (2) At write time, drives the data lines DQ and /DQ according to data to be written into (3) At read time, makes the data lines DQ and /DQ into the floating state.

Figure 6:
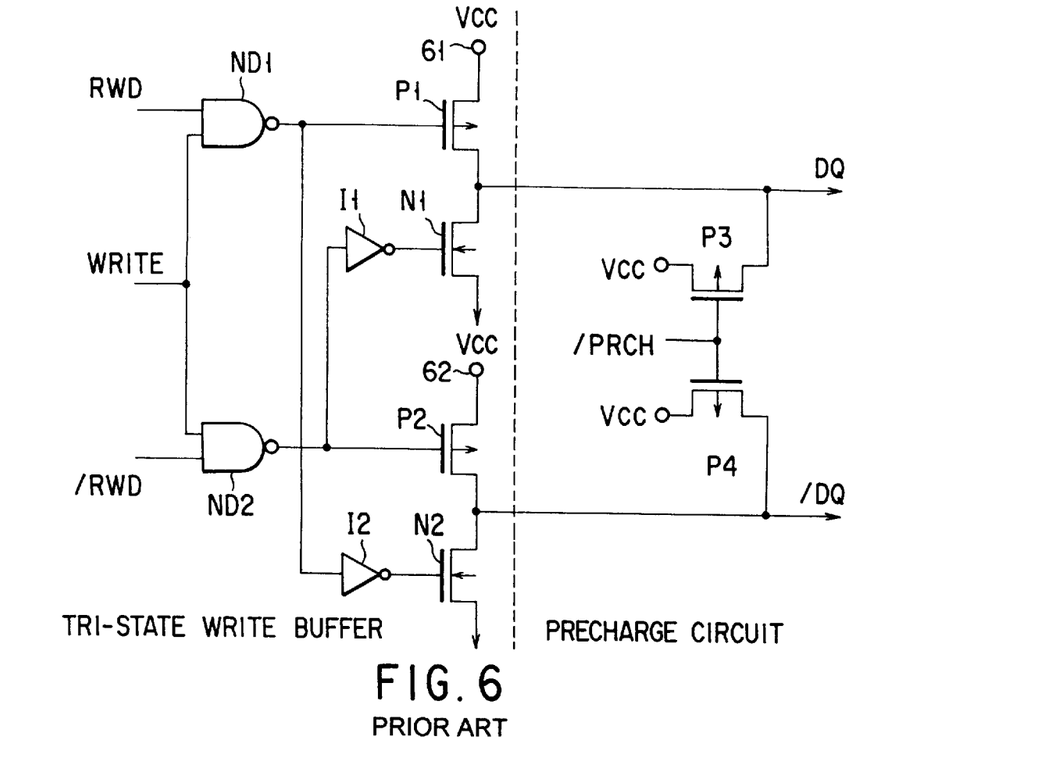
FIG. 6 is a circuit diagram of a prior art write amplifier.

FIG. 6 shows an example of a conventional DQ write amplifier, which is composed of a precharge circuit and a tri-state write buffer. The precharge circuit, which is constructed from P-channel MOS transistors P3 and P4, precharges the data lines DQ and /DQ to a supply potential Vcc via the transistors P3 and P4 when, in the standby state, a precharge signal /PRCH goes to a low level. At write time, the precharge signal goes to a high level, turning the transistors P3 and P4 off.

The tri-state write buffer is constructed from a P-channel MOS transistor P1 and an N-channel MOS transistor N1 which are connected in series between a power supply terminal 61 supplied with supply voltage Vcc and ground, a P-channel MOS transistor P2 and an N-channel MOS transistor N2 connected in series between a power supply terminal 62 supplied with the supply voltage Vcc and ground, and NAND circuits ND1 and ND2 and inverters I1 and I2 which control those transistors. The data line DQ is connected to the junction of the transistors P1 and N1, and the data line /DQ is connected to the junction of the transistors P2 and N2. The tri-state write buffer is controlled according to a write signal WRITE and data to be written into on write data buses RWD and /RWD. When the write signal WRITE goes high during a write operation, data on the data buses RWD and /RWD are transferred to the data lines DQ and /DQ via the tri-state buffer. To transfer read data from the sense amplifier to a DQ read amplifier during a read operation, the data lines DQ and /DQ are kept floating, the precharge signal /PRCH is set high, and the write signal WRITE is set low. The conventional DQ write amplifier has the following problems.

Figure 7:
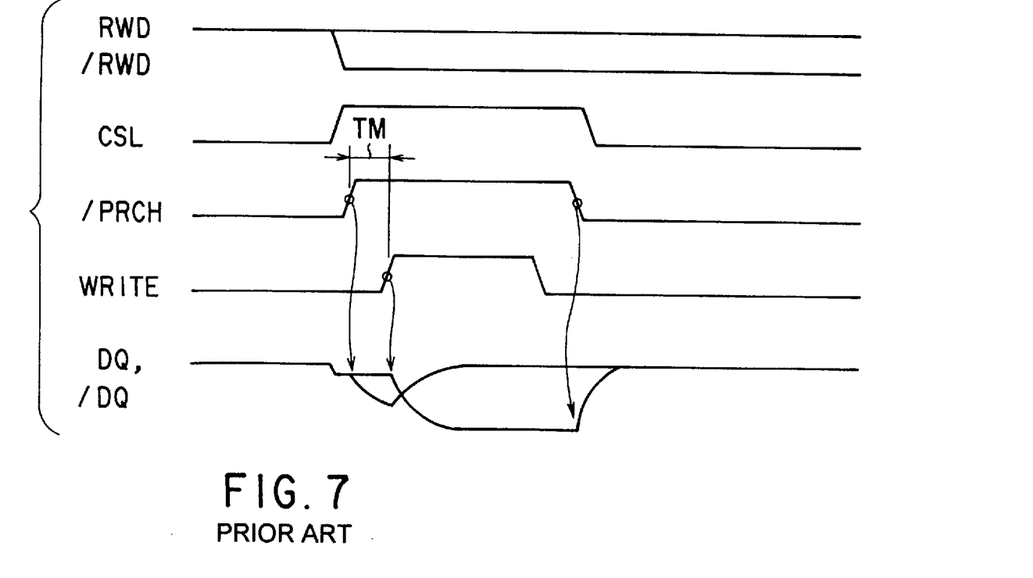
FIG. 7 is a timing diagram illustrating the operation of the write amplifier of FIG. 6.

FIG. 7 shows the operation of the DQ write amplifier of FIG. 6. During a write operation, the precharge signal /PRCH must be set high before the gwrite signal WRITE goes high for cutting DC current. path of the transistors P3 and N1 or the transistors P4 and N2. To realize this, it is required to set a time margin TM between the precharge signal /PRCH and the write signal WRITE. A column select signal CSL goes high almost at the same time the precharge signal /PRCH goes high, connecting the data lines DQ and /DQ to the sense amplifier. For this reason, where the time margin between the precharge signal /PRCH and the write signal WRITE is great, the data lines DQ or /DQ will go low before the write signal WRITE goes high, which delays the write operation and reduces the write speed. Further, since this DQ write amplifier drives the data lines DQ and /DQ of large capacitance, P-channel MOS transistors P1, P2, P3 and P4 of large size are needed. This will lead to an increase in the layout area occupied by this circuit on a chip.

BRIEF SUMMARY OF THE INVENTION

It is therefore an object of the present invention to provide a write amplifier which requires no time margin during write operation to thereby allow fast write operation and prevents an increase in circuit layout area on a semiconductor chip.

According to the present invention there is provided a write circuit for use in a semiconductor memory device comprising: a first data line; a second data line; a first drive circuit having a first transistor of a first conductivity type and a second transistor of a second conductivity type which are connected in series between first and second power supplies, the junction of the first and second transistors being connected to the first data line; a second drive circuit having a third transistor of the first conductivity type and a fourth transistor of the second conductivity type which are connected in series between the first and second power supplies, the junction of the third and fourth transistors being connected to the second data line; and a control circuit for controlling the first and second drive circuits in response to a read signal, a write signal, and a complementary pair of write data, the control circuit activating, in a precharge state, the first and second drive circuits in response to the read signal and the write signal to precharge the first and second data lines to a predetermined potential, deactivating, in a data read state, the first and second drive circuits in response to the read signal and the write signal to cause the first and second data lines to go into a floating state, and activating, in a data write state, the first and second drive circuits in response to the write signal to transfer the complementary pair of data to the first and second data lines.

According to the present invention, the data line driving transistors are used to precharge the data lines at precharge time. This eliminates the need of precharging transistors and a precharge signal for controlling the precharging transistors. Therefore, a transition can be made from the precharge state to the write state through the use of only the write signal. This eliminates the need of setting a time margin between the write signal and the precharge signal as in the prior art. Moreover, the voltages on the data lines can be prevented from lowering in making transition from the precharge state to the write state, which allows fast write operation.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate a presently preferred embodiment of the invention and together with the general description given above and the detailed description of the preferred embodiment given below, serve to explain the principles of the invention.

DETAILED DESCRIPTION OF THE INVENTION

Figure 1:
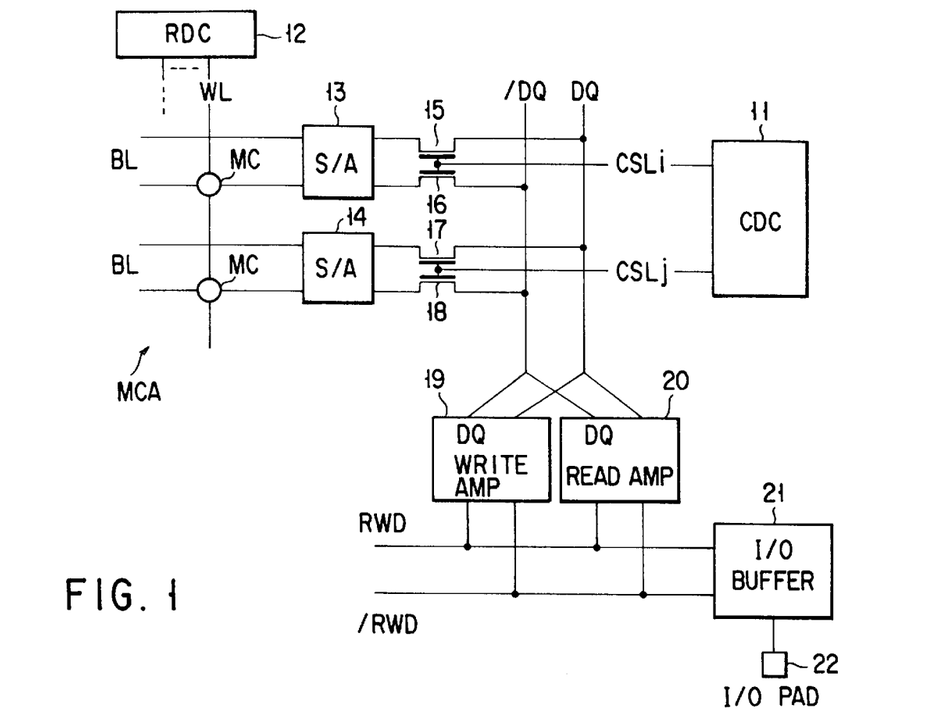
FIG. 1 is a schematic representation of a DRAM to which the present invention is applied.

FIG. 1, which is a schematic representation of a DRAM to which the present invention is applied, illustrates a schematic configuration of read and write paths in the DRAM. An memory cell array MCA has a number of memory cells MC arranged in a matrix of rows and columns. Only two memory cells are illustrated here for the purpose of simplifying the drawing. Though not shown, each memory cell is composed of one transistor and one capacitor. The cells are located at intersections of bit line pairs BL and word lines WL. The bit line pairs are selected by column select signals CSLi and CSLj outputted from a column decoder (CDC) 11 in response to an address signal. The word lines WL are each selected by a row decoder (RDC) 12 in response to an address signal. The bit line pairs are connected to sense amplifiers (S/A) 13 and 14. Paired transistors 15 and 16 are connected between the outputs of the sense amplifier 13 and paired data lines DQ and /DQ. Paired transistors 17 and 18 are connected between the outputs of the sense amplifier 14 and the paired data lines DQ and /DQ. Assume here that the transistors 15 and 16 are selected by the column select signal CSLi, while the transistors 17 and 18 are selected by the column select signal CSLj. The data lines DQ and /DQ are connected to the outputs of a DQ write amplifier 19 and to the inputs of a DQ read amplifier 20. The inputs of the write amplifier 19 and the outputs of the read amplifier 20 are connected to read/write data buses RWD and /RWD which, in turn, are connected through an input/output buffer 21 to an input/output pad 22. Any number of input/output buffers 21 and pads 22 can be provided.

Figure 2:
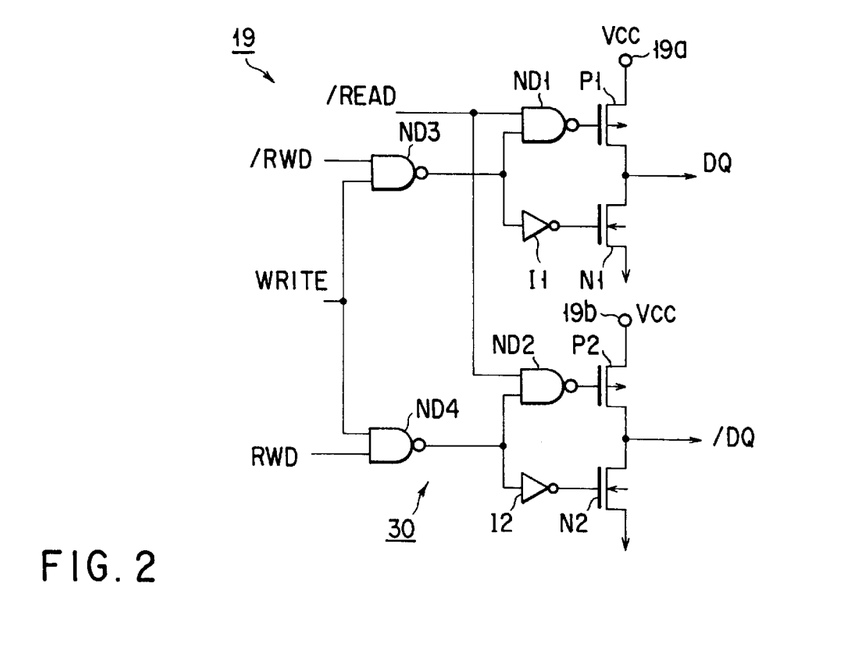
FIG. 2 a circuit diagram of a write amplifier according to a first embodiment of the present invention.

FIG. 2 shows a first embodiment of the DQ write amplifier 19 of FIG. 1. In this arrangement, a P-channel MOS transistor P1 precharges and drives the data line DQ, while a P-channel MOS transistor P2 precharges and drives the data line /DQ. That is, between a power supply terminal 19a supplied with a supply voltage Vcc as a first power supply and ground as a second power supply are connected in series the P-channel MOS transistor P1 and an N-channel MOS transistor N1, which are connected at their connection point to the data line DQ. Also, between a power supply terminal 19b supplied with the supply voltage Vcc and ground are connected in series the P-channel MOS transistor P2 and an N-channel MOS transistor N2, which are connected at their connection point to the data line /DQ. These transistors are controlled by a control circuit 30, which is composed of, for example, NAND circuits ND1, ND2, ND3, and ND4 and inverters I1 and I2. That is, a read signal /READ is applied to a first input of the NAND circuits ND1 and ND2. The output of the NAND circuit ND1 is connected to the gate of the P-channel MOS transistor P1, while the output of the NAND circuit ND2 is connected to the gate of the P-channel MOS transistor P2. A signal on the read/write data bus /RWD and a write signal WRITE are applied to the inputs of the NAND circuit ND3 the output of which is connected to a second input of the NAND circuit ND1 and to the gate of the transistor N1 through the inverter I1. Also, a signal on the read/write data bus RWD and the write signal WRITE are applied to the inputs of the NAND circuit ND4 the output of which is connected to a second input of the NAND circuit ND2 and to the gate of the transistor N2 through the inverter I2.

Figure 3:
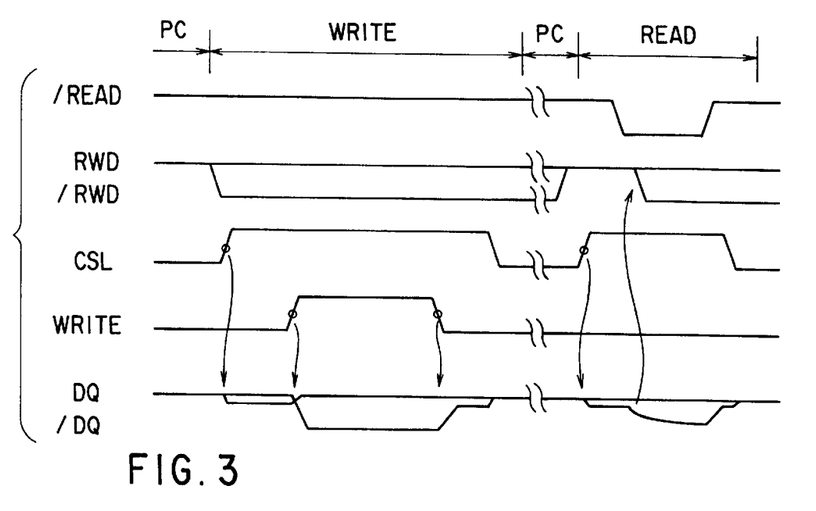
FIG. 3 is a timing diagram for use in explanation of the operation of the write amplifier of FIG. 2.

FIG. 3 is a timing diagram explanatory of the operation of the write amplifier of FIG. 2. In the standby state, the read signal /READ is set high, and the write signal WRITE is set low. Thus, the outputs of the NAND circuits ND1 and ND2 are low and the outputs of the inverters I1 and I2 are low, so that the transistors P1 and P2 are on, while the transistors N1 and N2 are off. As a result, the data lines DQ and /DQ are precharged to Vcc through the transistors P1 and P2.

During a write operation, the read signal /READ remains high, a column select signal CSL goes high, and write data is applied to the read/write data buses RWD and /RWD. Since the data lines DQ and /DQ are connected to bit lines through a sense amplifier by that column select signal CSL, the potential on one of the data lines DQ and /DQ lowers slightly. When, after that, the write signal WRITE goes high, the transistor P1 or P2 is turned off, depending on the input data on the data buses RWD and /RWD. When one of the transistors P1 and P2 is turned off, one of the transistors N1 and N2 is turned on which is connected to that P-channel transistor which was turned off. Therefore, the potential of the data line connected to the P-channel transistor in the on state to go high and the potential of the data line connected to the N-channel transistor in the on state to go low. Potentials of the data lines DQ and /DQ are transferred through the transmission gate transistors and the sense amplifier to the bit line pair selected by the column decoder, thereby writing into a selected memory cell associated with that bit line pair.

After the termination of the write operation, the memory returns to the precharge state. During a read operation subsequent to precharging, the column select signal first goes high and then the read signal /READ goes low. Consequently, the output signals of the NAND circuits ND1 and ND2 go high and the output signals of the inverters I1 and I2 remain low. Thus, all the transistors P1, P2, N1 and N2 go into the high-impedance state, causing the data lines DQ and /DQ to become floating.

According to the first embodiment, at precharge time, the data lines DQ and /DQ are precharged by the data line driving transistors P1 and P2. Unlike the conventional circuit, therefore, there is no need of precharging transistors and a precharge signal for controlling the precharging transistors. The DQ write amplifier can make a transition from the precharge state to the write state through the use of only the write signal WRITE. This eliminates the need of setting a time margin between the write signal WRITE and the precharge signal which is required with the conventional circuit. Moreover, the data line potential can be prevented from lowering in making a transition from the precharge state to the write state, which allows high-speed write operation.

Furthermore, the precharging transistors of large size and signal lines for transferring a precharge signal become unnecessary, helping reduce the circuit area on a semiconductor chip.

Figure 4:
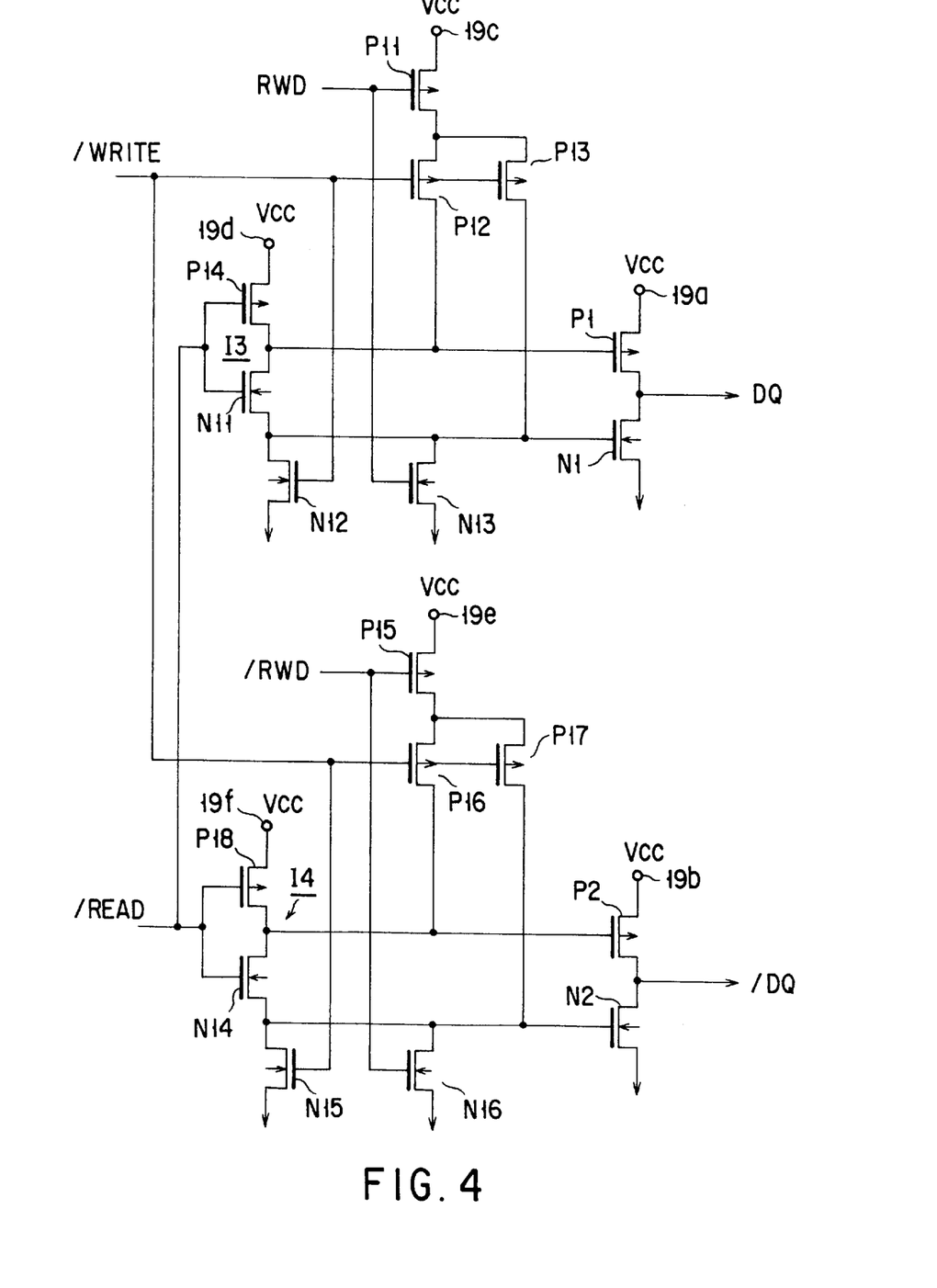
FIG. 4 is a circuit diagram of a write amplifier according to a second embodiment of the present invention.

FIG. 4 shows a second embodiment of the DQ write amplifier. In this figure, like reference numerals are used to denote corresponding parts to those in the first embodiment of FIG. 2. In the first embodiment, four NAND circuits and two inverters are used to control the driving transistors P1, P2, N1 and N2. In contrast, the second embodiment forms the control circuit from a plurality of MOS transistors for the purpose of further reducing the pattern layout area.

Between power supply terminal 19c supplied with supply voltage Vcc and the gate of transistor P1 are connected in series P-channel MOS transistors P11 and P12. A P-channel MOS transistor P13 is connected between the junction of the transistors P11 and P12 and the gate of the transistor N1. The gate of the transistor P11 is connected to the read/write data bus RWD. The write signal /WRITE is applied to the gates of the transistors P12 and P13. A P-channel MOS transistor P14 and N-channel MOS transistors N11 and N12 are connected between Vcc terminal 19d and ground. The read signal /READ is applied to the gates of the transistors P14 and N11 that forms a CMOS inverter I3. The junction of the transistors P14 and N11 is connected to the gate of the transistor P1. The write signal /WRITE is applied to the gate of the transistor N12. The junction of the transistors N11 and N12 is connected to the gate of the transistor N1. Further, an N-channel MOS transistor N13 is connected between the gate of the transistor N1 and ground and has its gate connected to the read/write data bus RWD.

Between Vcc terminal 19e and the gate of the transistor P2 are connected in series P-channel MOS transistors P15 and P16. A P-channel MOS transistor P17 is connected between the junction of the transistors P15 and P16 and the gate of a N-channel MOS transistor N2. The transistor P15 has its gate connected to the read/write data bus /RWD and the transistors P16 and P17 have their gates connected to receive the write signal /WRITE. A P-channel MOS transistor P18 and N-channel MOS transistors N14 and N15 are connected between Vcc terminal 19f and ground. The read signal /READ is applied to the gates of the transistors P18 and N14 that forms a CMOS inverter I4. The junction of the transistors P18 and N14 is connected to the gate of the transistor P2. The write signal /WRITE is applied to the gate of the transistor N15. The junction of the transistors N14 and N15 is connected to the gate of the transistor N2. Further, an N-channel MOS transistor N16 is connected between the gate of the transistor N2 and ground and has its gate connected to the read/write data bus /RWD. The transistors P11 through P18 are set smaller in size than the transistors P1 and P2.

Figure 5:
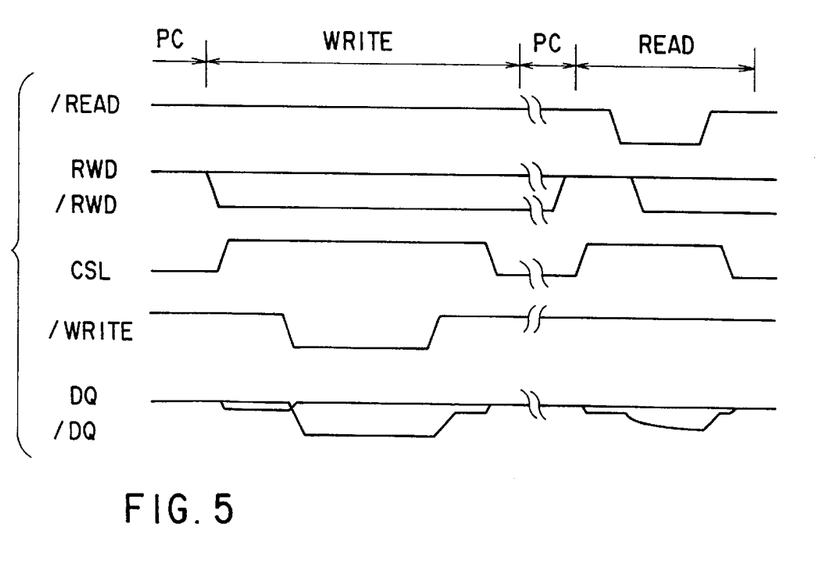
FIG. 5 is a timing diagram for use in explanation of the operation of the write amplifier of FIG. 4.

FIG. 5 illustrates the operation of the circuit of FIG. 4. This timing diagram differs from the timing diagram of FIG. 3 only in that the polarity of the write signal /WRITE is reversed. Thus, the operation of the circuit of FIG. 4 is substantially the same as that of the circuit of the first embodiment. That is, in the standby state, the read signal /READ and the write signal /WRITE are both set high. Thus, the output signals of the inverters I3 and I4 are both low, turning the transistors P1 and P2 on and the transistors N1 and N2 off. The data lines DQ and /DQ are therefore precharged to Vcc through the transistors P1 and P2 which are in the conductive state.

During a write operation, the read signal /READ is kept high, a column select signal CSL goes high, and write data appears on the read/write data buses RWD and /RWD. The column select signal CSL at a high level connects the data lines DQ and /DQ through a sense amplifier to bit lines, so that the potential on one of the data lines lowers slightly. After that, the write signal /WRITE goes low. In this state, the transistors P1, P2, P11 to P13, P15 to P17, and the transistors N1, N2, N13, and N16 are controlled in accordance with the write data on the read/write data buses RWD and /RWD. For example, RWD is high and /RWD is low, the transistor P11 is turned off and the transistor P15 is turned on. At this point, since the transistor N12 is off and transistors N11 and N13 are on, the transistors P1 is kept on and N1 is kept off. Thus, the data line DQ is kept at a high level. On the other hand, the transistors P16 and P17 which are connected to the transistor P15 in the on state are on and the transistors N15 and N16 are off. Thus, the transistors P2 turns off and the transistor N2 turns on, causing the data line /DQ to go to a low level. When the voltage levels on the data buses RWD and /RWD are reversed, the voltage levels on the data lines DQ and /DQ are also reversed accordingly.

The potentials of the data lines DQ and /DQ are transferred through the transmission gate transistors and the sense amplifier to the bit line pair, whereby a selected memory cell is written into.

After the termination of the write operation, the memory returns to the precharge state. During a read operation, a column select signal first goes high and then the read signal /READ goes low. The write signal /WRITE is kept at a high level. As a result, the transistors N12 and N15 are on and the output signals of the inverters I3 and I4 goes to a high level, which causes each of the transistors P1, P2, N1, and N2 to go into the high-impedance state. Thus, the data lines DQ and /DQ becomes floating.

In the second embodiment, as with the first embodiment, a high-speed write operation can be achieved. Moreover, the transistors P11 to P18 are set smaller in size than the transistors P1 and P2, and the number of transistors required can be reduced in comparison with the case where, as in the first embodiment, NAND circuits are used. The circuit of the second embodiment therefore can be further reduced in the occupied area on a chip in comparison with the first embodiment circuit.

In the above embodiments, the power supply terminals 19a and 19b of the driving system of the DQ write amplifier 19 and the power supply terminals 19c, 19d, 19e and 19f of the control circuit system thereof are applied with the same power supply voltage Vcc. However, this in no way restricts the present invention. For example, the power supply voltage applied to the former terminals 19a and 19b may be lower in level than that applied to the latter terminals 19c, 19d, 19e and 19f. To be specific, a voltage of 1.8 V and a voltage of 2.5 V may be applied to the former terminals and latter terminals, respectively. Where the power supply voltages are determined in this manner, the discharge current on data lines DQ and /DQ can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A write circuit for use in a semiconductor memory device comprising:

a first data line;

a second data line;

a first drive circuit having a first transistor of a first conductivity type and a second transistor of a second conductivity type which are connected in series between first and second power supplies, the junction of the first and second transistors being connected to the first data line;

a second drive circuit having a third transistor of the first conductivity type and a fourth transistor of the second conductivity type which are connected in series between the first and second power supplies, the junction of the third and fourth transistors being connected to the second data line; and a control circuit for controlling the first and second drive circuits in response to a read signal, a write signal, and a complementary pair of write data, the control circuit activating, in a precharge state, the first and second drive circuits in response to the read signal and the write signal to precharge the first and second data lines to a predetermined potential, deactivating, in a data read state, the first and second drive circuits in response to the read signal and the write signal to cause the first and second data lines to go into a floating state, and activating, in a data write state, the first and second drive circuits in response to the write signal to transfer the complementary pair of data to the first and second data lines.

2. A circuit according to claim 1, wherein the control circuit comprises:

a first NAND circuit having its inputs connected to receive the write signal and one of the complementary pair of data;

a second NAND circuit having its inputs connected to receive an output signal of the first NAND circuit and the read signal and its output connected to the gate of the first transistor;

a first inverter having its input connected to receive the output signal of the first NAND circuit and its output connected to the gate of the second transistor;

a third NAND circuit having inputs connected to receive the write signal and the other of the complementary pair of data;

a fourth NAND circuit having its inputs connected to receive an output signal of the third NAND circuit and the read signal and its output connected to the gate of the third transistor; and a second inverter having its input connected to receive the output signal of the third NAND circuit and its output connected to the gate of the fourth transistor.

3. A circuit according to claim 1, wherein the control circuit comprises:

a fifth transistor of the first conductivity type having its current path connected at one end thereof to the first power supply and its gate connected to receive one of the complementary pair of data;

a sixth transistor of the first conductivity type connected between the other end of the current path of the fifth transistor and the gate of the first transistor and having its gate connected to receive an inverted signal of the write signal;

a seventh transistor of the first conductivity type connected between the other end of the current path of the fifth transistor and the gate of the second transistor and its gate connected to receive the inverted signal of the write signal;

an eighth transistor of the first conductivity type having its current path connected at one end thereof to the first power supply and at the other end thereof to the gate of the first transistor and its gate connected to receive the read signal;

a ninth transistor of the second conductivity type having its current path connected at one end thereof to the other end of the current path of the eighth transistor and at the other end thereof to the gate of the second transistor and its gate connected to receive the read signal;

a tenth transistor of the second conductivity type having its current path connected at one end thereof to the other end of the current path of the ninth transistor and at the other end thereof to the second power supply and its gate connected to receive the inverted signal of the write signal;

an eleventh transistor of the second conductivity type having its current path connected at one end thereof to the other end of the current path of the ninth transistor and at the other end thereof to the second power supply and its gate connected to receive one of the complementary pair of data;

a twelfth transistor of the first conductivity type having its current path connected at one end thereof to the first power supply and its gate connected to receive the other of the complementary pair of data;

a thirteenth transistor connected between the other end of the current path of the twelfth transistor and the gate of the third transistor and having its gate connected to receive the inverted signal of the write signal;

a fourteenth transistor of the first conductivity type connected between the other end of the twelfth transistor and the gate of the fourth transistor and its gate connected to receive the inverted signal of the write signal;

a fifteen transistor of the first conductivity type having its current path connected at one end thereof to the first power supply and at the other end thereof to the gate of the third transistor and its gate connected to receive the read signal;

a sixteenth transistor of the second conductivity type having its current path connected at one end thereof to the other end of the current path of the fifteenth transistor and at the other end thereof to the gate of the fourth transistor and its gate connected to receive the read signal;

a seventeenth transistor of the second conductivity type having its current path connected at one end thereof to the other end of the current path of the sixteenth transistor and at the other end thereof to the second power supply and its gate connected to receive the inverted signal of the write signal; and an eighteenth transistor of the second conductivity type having its current path connected at one end thereof to the other end of the current path of the sixteenth transistor and at the other end thereof to the second power supply and its gate connected to receive the other of the complementary pair of data.

4. A circuit according to claim 3, wherein the fifth, sixth, seventh, eighth, twelfth, thirteenth, fourteenth and fifteenth transistors are set smaller in size than the first and second transistors.

5. A semiconductor memory device comprising:
a memory cell array having memory cells arranged in rows and columns;
word lines associated with the memory cells;
bit line pairs associated with the memory cells;
a row decoder responsive to an address signal for selecting one of the word lines;
sense amplifiers each associated with a corresponding respective one of the bit line pairs for amplifying a potential difference across the corresponding bit line pair;
a first data line;
a second data line;
transistor pairs each for, when selected, connecting a corresponding sense amplifier to the first and second data line;
a column decoder responsive to an address signal for selecting one of the transistor pairs;
a first drive circuit having a first transistor of a first conductivity type and a second transistor of a second conductivity type which are connected in series between first and second power supplies, the junction of the first and second transistors being connected to the first data line;
a second drive circuit having a third transistor of the first conductivity type and a fourth transistor of the second conductivity type which are connected in series between the first and second power supplies, the junction of the third and fourth transistors being connected to the second data line; and
a control circuit for controlling the first and second drive circuits in response to a read signal, a write signal, and a complementary pair of write data, the control circuit activating, in a precharge state, the first and second drive circuits in response to the read signal and the write signal to precharge the first and second data lines to a predetermined potential, deactivating, in a data read state, the first and second drive circuits in response to the read signal and the write signal to cause the first and second data lines to go into a floating state, and activating, in a data write state, the first and second drive circuits in response to the write signal to transfer the complementary pair of data to the first and second data lines.

6. A device according to claim 5, wherein the control circuit comprises:
a first NAND circuit having its inputs connected to receive the write signal and one of the complementary pair of data;
a second NAND circuit having its inputs connected to receive an output signal of the first NAND circuit and the read signal and its output connected to the gate of the first transistor;
a first inverter having its input connected to receive the output signal of the first NAND circuit and its output connected to the gate of the second transistor;
a third NAND circuit having inputs connected to receive the write signal and the other of the complementary pair of data;
a fourth NAND circuit having its inputs connected to receive an output signal of the third NAND circuit and the read signal and its output connected to the gate of the third transistor; and
a second inverter having its input connected to receive the output signal of the third NAND circuit and its output connected to the gate of the fourth transistor.

7. A device according to claim 5, wherein the control circuit comprises:
a fifth transistor of the first conductivity type having its current path connected at one end thereof to the first power supply and its gate connected to receive one of the complementary pair of data;
a sixth transistor of the first conductivity type connected between the other end of the current path of the fifth transistor and the gate of the first transistor and having its gate connected to receive an inverted signal of the write signal;
a seventh transistor of the first conductivity type connected between the other end of the current path of the fifth transistor and the gate of the second transistor and its gate connected to receive the inverted signal of the write signal;
an eighth transistor of the first conductivity type having its current path connected at one end thereof to the first power supply and at the other end thereof to the gate of the first transistor and its gate connected to receive the read signal;
a ninth transistor of the second conductivity type having its current path connected at one end thereof to the other end of the current path of the eighth transistor and at the other end thereof to the gate of the second transistor and its gate connected to receive the read signal;
a tenth transistor of the second conductivity type having its current path connected at one end thereof to the other end of the current path of the ninth transistor and at the other end thereof to the second power supply and its gate connected to receive the inverted signal of the write signal;
an eleventh transistor of the second conductivity type having its current path connected at one end thereof to the other end of the current path of the ninth transistor and at the other end thereof to the second power supply and its gate connected to receive one of the complementary pair of data;
a twelfth transistor of the first conductivity type having its current path connected at one end thereof to the first power supply and its gate connected to receive the other of the complementary pair of data;
a thirteenth transistor connected between the other end of the current path of the twelfth transistor and the gate of the third transistor and having its gate connected to receive the inverted signal of the write signal;
a fourteenth transistor of the first conductivity type connected between the other end of the twelfth transistor and the gate of the fourth transistor and its gate connected to receive the inverted signal of the write signal;
a fifteen transistor of the first conductivity type having its current path connected at one end thereof to the first power supply and at the other end thereof to the gate of the third transistor and its gate connected to receive the read signal;
a sixteenth transistor of the second conductivity type having its current path connected at one end thereof to the other end of the current path of the fifteenth transistor and at the other end thereof to the gate of the third transistor and its gate connected to receive the read signal;
a seventeenth transistor of the second conductivity type having its current path connected at one end thereof to the other end of the current path of the sixteenth transistor and at the other end thereof to the second power supply and its gate connected to receive the inverted signal of the write signal; and an eighteenth transistor of the second conductivity type having its current path connected at one end thereof to the other end of the current path of the sixteenth transistor and at the other end thereof to the second power supply and its gate connected to receive the other of the complementary pair of data.

8. A device according to claim 7, wherein the fifth, sixth, seventh, eighth, twelfth, thirteenth, fourteenth and fifteenth transistors are set smaller in size than the first and second transistors.

9. A circuit according to claim 1, wherein the control circuit comprises:

a fifth transistor of the first conductivity type having its current path connected at one end thereof to a third power supply and its gate connected to receive one of the complementary pair of data, said first power supply being lower than the third power supply and higher than the second power supply;

a sixth transistor of the first conductivity type connected between the other end of the current path of the fifth transistor and the gate of the first transistor and having its gate connected to receive an inverted signal of the write signal;

a seventh transistor of the first conductivity type connected between the other end of the current path of the fifth transistor and the gate of the second transistor and its gate connected to receive the inverted signal of the write signal;

an eighth transistor of the first conductivity type having its current path connected at one end thereof to the third power supply and at the other end thereof to the gate of the first transistor and its gate connected to receive the read signal;

a ninth transistor of the second conductivity type having its current path connected at one end thereof to the other end of the current path of the eighth transistor and at the other end thereof to the gate of the second transistor and its gate connected to receive the read signal;

a tenth transistor of the second conductivity type having its current path connected at one end thereof to the other end of the current path of the ninth transistor and at the other end thereof to the second power supply and its gate connected to receive the inverted signal of the write signal;

an eleventh transistor of the second conductivity type having its current path connected at one end thereof to the other end of the current path of the ninth transistor and at the other end thereof to the second power supply and its gate connected to receive one of the complementary pair of data;

a twelfth transistor of the first conductivity type having its current path connected at one end thereof to the third power supply and its gate connected to receive the other of the complementary pair of data;

a thirteenth transistor connected between the other end of the current path of the twelfth transistor and the gate of the third transistor and having its gate connected to receive the inverted signal of the write signal;

a fourteenth transistor of the first conductivity type connected between the other end of the twelfth transistor and the gate of the fourth transistor and its gate connected to receive the inverted signal of the write signal;

a fifteen transistor of the first conductivity type having its current path connected at one end thereof to the third power supply and at the other end thereof to the gate of the third transistor and its gate connected to receive the read signal;

a sixteenth transistor of the second conductivity type having its current path connected at one end thereof to the other end of the current path of the fifteenth transistor and at the other end thereof to the gate of the fourth transistor and its gate connected to receive the read signal;

a seventeenth transistor of the second conductivity type having its current path connected at one end thereof to the other end of the current path of the sixteenth transistor and at the other end thereof to the second power supply and its gate connected to receive the inverted signal of the write signal; and an eighteenth transistor of the second conductivity type having its current path connected at one end thereof to the other end of the current path of the sixteenth transistor and at the other end thereof to the second power supply and its gate connected to receive the other of the complementary pair of data.

10. A device according to claim 9, wherein the fifth, sixth, seventh, eighth, twelfth, thirteenth, fourteenth and fifteenth transistors are set smaller in size than the first and second transistors.

11. A device according to claim 5, wherein the control circuit comprises:

a fifth transistor of the first conductivity type having its current path connected at one end thereof to a third power supply and its gate connected to receive one of the complementary pair of data, said first power supply being lower than the third power supply and higher than the second power supply;

a sixth transistor of the first conductivity type connected between the other end of the current path of the fifth transistor and the gate of the first transistor and having its gate connected to receive an inverted signal of the write signal;

a seventh transistor of the first conductivity type connected between the other end of the current path of the fifth transistor and the gate of the second transistor and its gate connected to receive the inverted signal of the write signal;

an eighth transistor of the first conductivity type having its current path connected at one end thereof to the third power supply and at the other end thereof to the gate of the first transistor and its gate connected to receive the read signal;

a ninth transistor of the second conductivity type having its current path connected at one end thereof to the other end of the current path of the eighth transistor and at the other end thereof to the gate of the second transistor and its gate connected to receive the read signal;

a tenth transistor of the second conductivity type having its current path connected at one end thereof to the other end of the current path of the ninth transistor and at the other end thereof to the second power supply and its gate connected to receive the inverted signal of the write signal;

an eleventh transistor of the second conductivity type having its current path connected at one end thereof to the other end of the current path of the ninth transistor and at the other end thereof to the second power supply and its gate connected to receive one of the complementary pair of data;

a twelfth transistor of the first conductivity type having its current path connected at one end thereof to the third power supply and its gate connected to receive the other of the complementary pair of data;

a thirteenth transistor connected between the other end of the current path of the twelfth transistor and the gate of the third transistor and having its gate connected to receive the inverted signal of the write signal;

a fourteenth transistor of the first conductivity type connected between the other end of the twelfth transistor and the gate of the fourth transistor and its gate connected to receive the inverted signal of the write signal;

a fifteen transistor of the first conductivity type having its current path connected at one end thereof to the third power supply and at the other end thereof to the gate of the third transistor and its gate connected to receive the read signal;

a sixteenth transistor of the second conductivity type having its current path connected at one end thereof to the other end of the current path of the fifteenth transistor and at the other end thereof to the gate of the fourth transistor and its gate connected to receive the read signal;

a seventeenth transistor of the second conductivity type having its current path connected at one end thereof to the other end of the current path of the sixteenth transistor and at the other end thereof to the second power supply and its gate connected to receive the inverted signal of the write signal; and an eighteenth transistor of the second conductivity type having its current path connected at one end thereof to the other end of the current path of the sixteenth transistor and at the other end thereof to the second power supply and its gate connected to receive the other of the complementary pair of data.

12. A device according to claim 11, wherein the fifth, sixth, seventh, eighth, twelfth, thirteenth, fourteenth and fifteenth transistors are set smaller in size than the first and second transistors.

* * * * *